United States Patent
Matsushita

(10) Patent No.: US 7,323,932 B2
(45) Date of Patent: Jan. 29, 2008

(54) SILICON-ON-INSULATOR DIFFERENTIAL AMPLIFIER CIRCUIT

(75) Inventor: Yuichi Matsushita, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 129 days.

(21) Appl. No.: 11/326,491

(22) Filed: Jan. 6, 2006

(65) Prior Publication Data

US 2006/0164166 A1    Jul. 27, 2006

(30) Foreign Application Priority Data

Jan. 25, 2005   (JP)   ............................ 2005-016920

(51) Int. Cl.
H03F 3/45   (2006.01)
(52) U.S. Cl. .................... 330/253; 330/257; 330/261
(58) Field of Classification Search ............. 330/253, 330/257, 261; 327/359, 563

See application file for complete search history.

(56) References Cited

U.S. PATENT DOCUMENTS 6,018,267 A *   1/2000   Tran et al. .................. 330/253
6,326,847 B1 *  12/2001  Xu .............................. 330/253

FOREIGN PATENT DOCUMENTS

| JP | 8-213564   | 8/1996 |
| JP | 9-45883    | 2/1997 |
| JP | 2001-23376 | 1/2001 |

* cited by examiner

Primary Examiner—Khanh Van Nguyen
(74) Attorney, Agent, or Firm—Nixon Peabody LLP; Donald R. Studebaker

(57) ABSTRACT

A differential amplifier formed on a silicon-on-insulator substrate, including means to prevent the bodies of its differential input transistors from charging to unwanted potentials in the standby state. In one aspect of the invention, the means takes the form of switching transistors inserted between the differential input transistors and their loads. In another aspect of the invention, the means takes the form of switching transistors inserted between the sources and bodies of the differential input transistors. In another aspect of the invention the means is a regulator section that holds the bodies of the differential input transistors at an appropriate potential level.

6 Claims, 4 Drawing Sheets

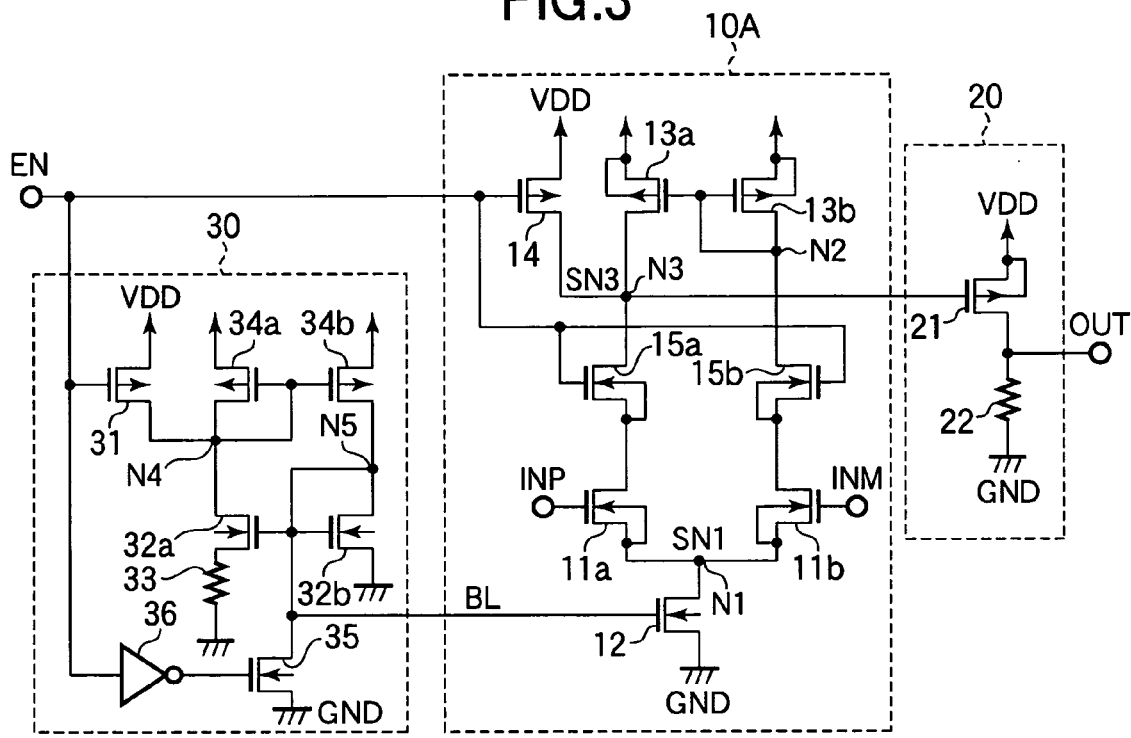
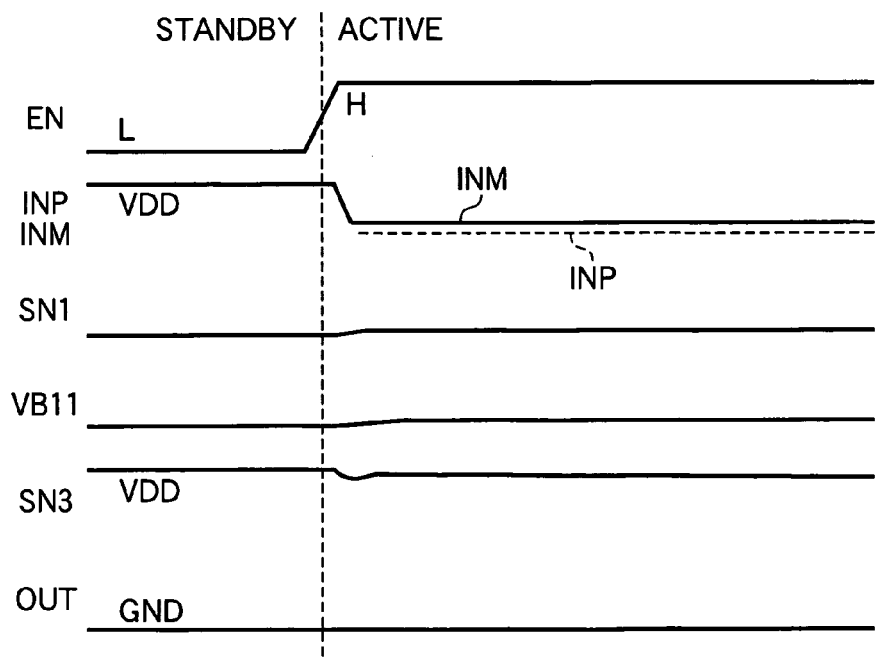

SILICON-ON-INSULATOR DIFFERENTIAL AMPLIFIER CIRCUIT

BACKGROUND OF THE INVENTION

1. Field of the Invention

The present invention relates to a differential amplifier circuit in a silicon-on-insulator (SOI) device.

2. Description of the Related Art

A conventional differential amplifier has a well-known configuration comprising an amplifier section 10, an output section 20, and a bias section 30 as shown in FIG. 1. The amplifier section 10 includes a pair of n-channel metal-oxide-semiconductor field-effect transistors (referred to below as NMOS transistors) 11a, 11b with sources connected to a node N1 and gates that receive respective differential input signals INP, INM. Node N1 is connected to ground (GND) through an NMOS transistor 12 that receives a bias potential BL at its gate. The drains of NMOS transistors 11a, 11b are connected to respective nodes N3, N2, which are connected to the power supply potential (VDD) through respective p-channel metal-oxide-semiconductor (PMOS) transistors 13a, 13b. The gates of PMOS transistors 13a, 13b are both connected to node N2. Node N3 is also connected to VDD through another PMOS transistor 14, which receives an enable signal EN at its gate.

The output section 20 includes a PMOS transistor 21 and a resistor 22. PMOS transistor 21 has its source connected to VDD, its gate connected to node N3 in the amplifier section 10A, and its drain connected to ground through the resistor 22. The output signal (OUT) of the differential amplifier is taken from the drain of PMOS transistor 21.

The bias section 30 receives the enable signal EN and, when the enable signal EN is active (high), holds the bias potential BL at a level such that NMOS transistor 12 conducts a predetermined current to ground.

To raise their withstand voltage, NMOS transistors 11a, 11b and PMOS transistors 13a, 13b in the amplifier section 10 and PMOS transistor 21 in the output section 20 are source-tied transistors, meaning that their respective substrate potentials are tied to their source potentials. The reason for this is that in an SOI device, the substrate is a thin silicon layer formed on an insulator such as glass. Accordingly, the body (the region between the source and drain regions) of an SOI transistor, differing from the body of a transistor formed on a conventional bulk silicon semiconductor substrate, is electrically isolated. If a large flow of current passes between the source and drain, hot carriers (electrons or holes) moving into the body may electrically charge the body until finally latch-up occurs. To prevent latch-up, in an NMOS transistor, for example, part of the junction between the N$^+$ source region and the P-type body is a P$^+$ region that is connected to the source region so that the body can discharge. A transistor having this configuration is referred to as a source-tied transistor.

Other methods of preventing floating substrate effects in SOI transistors are disclosed in Japanese Patent Application Publications No. H8-213564, H9-45883, and 2001-23376.

Next, the operation of the conventional differential amplifier circuit will be described.

In the standby state, in which the enable signal EN is inactive (low), the bias section 30 is deactivated and the bias potential BL drops to the ground level. The amplifier section 10 accordingly suspends operation and does not conduct any current to ground. PMOS transistor 14 is switched on, and pulls the signal SN3 at node N3 up to the VDD level. PMOS transistor 21 in the output section 20 is accordingly switched off, and the output signal (OUT) is at the ground level.

When the enable signal EN goes high, the bias section 30 starts operating, supplying the bias potential BL to the amplifier section 10. NMOS transistor 12 then starts conducting a predetermined operating current to ground. If the two differential input signals INP, INM are at the same voltage level, the operating current flow is divided equally between the two paths leading through NMOS transistors 11a and 11b, and the signal SN3 at node N3 has a level that allows PMOS transistor 21 to conduct a certain amount of current in the output section 20, bringing the output signal (OUT) to a certain level. If the level of differential input signal INP becomes higher than the level of differential input signal INM, the level of signal SN3 falls and the output signal (OUT) rises; if the level of differential input signal INP becomes lower than the level of differential input signal INM, the level of signal SN3 rises and the output signal (OUT) falls. The output voltage depends on the voltage difference between the differential input signals INP, INM.

FIG. 2 shows a waveform diagram illustrating the operation of the differential amplifier in FIG. 1 at a standby-to-active transition, illustrating the case in which the differential input signals INP, INM are both held at the VDD level in the standby state.

In the standby state, the enable signal EN is low (L), the signal SN3 at node N3 is pulled up to the power supply potential VDD, the differential input signals INP, INM are also at the VDD level, and NMOS transistor 12 is switched off. In this state, the potential SN1 at node N1 is pulled up to VDD−Vtn, where Vtn is the threshold voltage of NMOS transistors 11a, 11b. The source and body potential VB11 of NMOS transistors 11a, 11b is also pulled up to VDD−Vtn.

When the enable signal EN goes high (H), the differential input signals INP, INM fall to externally determined levels. If, for example, INP goes to a lower level than INM (INP<INM), the potential SN1 at node N1 falls to INM−Vtn. The bodies of NMOS transistors 11a, 11b also discharge to this potential, but since the discharge takes place gradually through the P$^+$ regions in NMOS transistors 11a, 11b, the body potential VB11 takes time to reach the source level (SN1) at node N1.

During the period in which the source level differs from the body level in NMOS transistors 11a, 11b, the drain current characteristics of NMOS transistors 11a, 11b vary due to substrate effects. In general, when the body potential is higher than the source potential, the threshold voltage drops, the drain current increases, and the output signal level (OUT) no longer depends properly on the voltage difference between the differential input signals INP, INM.

If dimensional differences exist between NMOS transistors 11a, 11b, they cause a particular problem because the size of the substrate effect differs, destroying the balance in the differential amplifier circuit. Because the gate-source voltages VGS of NMOS transistors 11a, 11b operate near the threshold voltage Vtn, when the potential difference between the differential input signals INP, INM is small, as the substrate effect alters the transistor characteristics, it may also reverse the size relationship between the drain currents, resulting in a false output signal (OUT) as shown in FIG. 2.

SUMMARY OF THE INVENTION

An object of the present invention is to prevent malfunction of an SOI differential amplifier circuit due to the substrate effect of a source-tied transistor.

A differential amplifier circuit formed on an SOI substrate according the present invention includes a bias section activated and deactivated by an enable signal. The bias section outputs a predetermined bias potential when activated, and a first power-supply potential when deactivated, to the gate of a first MOS transistor of a first channel type, which receives the first power-supply potential at its source. Second and third MOS transistors of the first channel type have their sources connected to the drain of the first MOS transistor of the first channel type and receive respective differential input signals at their gates. The drain of the second MOS transistor of the first channel type is connected to a second power-supply potential through a first MOS transistor of a second channel type. The drain of the third MOS transistor of the first channel type is connected to the second power-supply potential through a second MOS transistor of the second channel type. An output section generates an output signal from the drain potential of the first MOS transistor of the second channel type.

In a first aspect of the invention, a fourth MOS transistor of the first channel type is inserted between the drains of the second MOS transistor of the first channel type and the first MOS transistor of the second channel type. A fifth MOS transistor of the first channel type is inserted between the drains of the third MOS transistor of the first channel type and the second MOS transistor of the second channel type. The fourth and fifth MOS transistors of the first channel type receive the enable signal at their gates. The second, third, fourth and fifth transistors of the first channel type and the first and second MOS transistors of the second channel type are source-tied. When the enable signal is inactive, the fourth and fifth MOS transistors of the first channel type are switched off, leaving the second and third MOS transistors of the first channel type in a floating state so that they maintain their existing body potentials.

In a second aspect of the invention, a fourth MOS transistor of the first channel type is inserted between the source and body of the second MOS transistor of the first channel type. A fifth MOS transistor of the first channel type is inserted between the source and body of the third MOS transistor of the first channel type. The fourth and fifth MOS transistors of the first channel type receive the enable signal at their gates. The fourth and fifth transistors of the first channel type and the first and second MOS transistors of the second channel type are source-tied. The second and third MOS transistors of the first channel type are source-tied when the enable signal is active, but are not source-tied when the enable signal is inactive.

A third aspect of the invention provides a regulator section that supplies a stable potential, substantially equal to the drain potential of the first MOS transistor of the first channel type when the enable signal is active, to the bodies of the second and third MOS transistors of the first channel type, thereby holding the bodies of the second and third MOS transistors of the first channel type at an appropriate potential at all times.

All three aspects of the invention prevent the body potentials of the second and third MOS transistors of the first channel type from being pulled toward the second power-supply potential while the enable signal is inactive.

BRIEF DESCRIPTION OF THE DRAWINGS

In the attached drawings:

FIG. 3 is a circuit diagram of a differential amplifier according to a first embodiment of the invention;

FIG. 4 is a waveform diagram illustrating the operation of the differential amplifier in FIG. 3 at a standby-to-active transition;

DETAILED DESCRIPTION OF THE INVENTION

Figure 1:
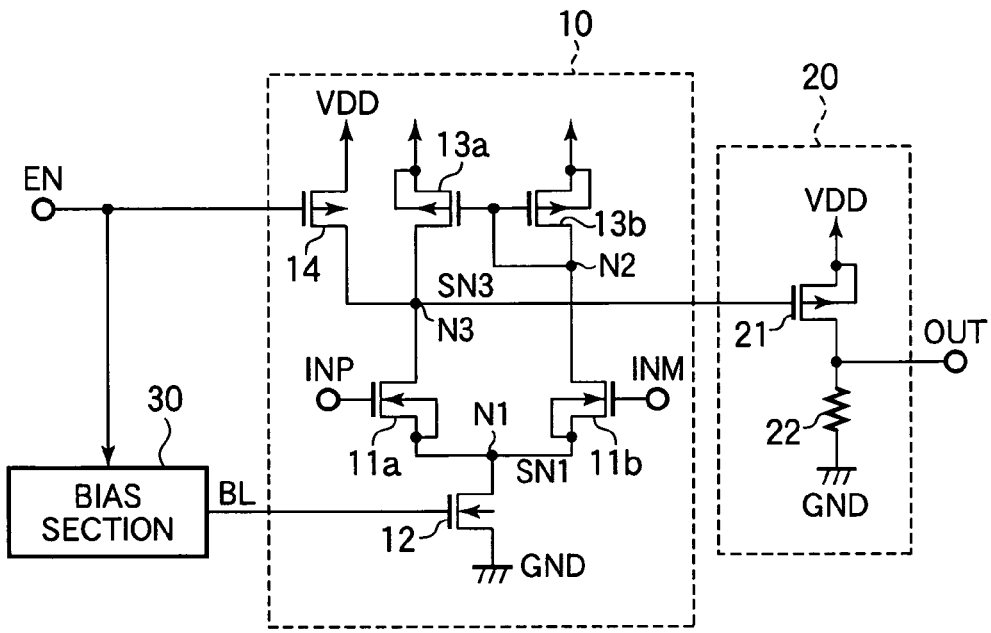
FIG. 1 is a circuit diagram of a conventional differential amplifier.

Embodiments of the invention will now be described with reference to the attached drawings, in which like elements are indicated by like reference characters. The embodiments are differential amplifiers including NMOS and PMOS transistors formed in an SOI substrate. Some of the transistors are source-tied SOI transistors, meaning that their body potential is tied to their source potential.

First Embodiment

Referring to FIG. 3, the first embodiment is a differential amplifier comprising an amplifier section 10A, an output section 20, and a bias section 30.

The amplifier section 10A comprises a pair of source-tied NMOS transistors 11a, 11b that receive differential input signals INP, INM at their gates. The sources of both transistors 11a, 11b are connected to a first node N1, which is connected to the drain of an NMOS transistor 12. The gate of NMOS transistor 12 receives a bias potential BL from the bias section 30. The source of NMOS transistor 12 is connected to ground.

The amplifier section 10A also includes a pair of source-tied PMOS transistors 13a, 13b both having their sources connected to the power supply (VDD). PMOS transistor 13a has its gate connected to a second node N2 and its drain connected to a third node N3. PMOS transistor 13b has its gate and drain both connected to the second node N2. Another PMOS transistor 14 has its source connected to the power supply VDD and its drain connected to the third node N3. The gate of PMOS transistor 14 receives an enable signal EN.

In addition, the amplifier section 10A includes a novel pair of source-tied NMOS transistors 15a, 15b, both of which receive the enable signal EN at their gates. NMOS transistor 15a has its source connected to the drain of NMOS transistor 11a and its drain connected to the third node N3. NMOS transistor 15b has its source connected to the drain of NMOS transistor 11b and its drain connected to the second node N2.

The output section 20 includes a source-tied PMOS transistor 21 and a resistor 22. PMOS transistor 21 has its source connected to VDD, its gate connected to the third node N3 in the amplifier section 10A, and its drain connected to ground through the resistor 22. The output signal (OUT) of the differential amplifier is taken from the drain of PMOS transistor 21.

When the enable signal EN is active (high), the bias section 30 holds the bias potential BL at a level such that NMOS transistor 12 conducts a predetermined flow of current to ground. The bias section 30 has, for example, the following circuit configuration.

The bias section 30 in FIG. 3 includes a PMOS transistor 31 having its source connected to the power supply (VDD) and its drain connected to a fourth node N4. The gate of PMOS transistor 31 receives the enable signal EN. The bias section 30 also includes a pair of NMOS transistors 32a, 32b. NMOS transistor 32a has its source connected to ground through a resistor 33, which is in series with NMOS transistor 32a, its gate connected to a fifth node N5, and its drain connected to the fourth node N4. NMOS transistor 32b has its source connected to ground, and its gate and drain both connected to the fifth node N5. The bias section 30 also includes a pair of PMOS transistors 34a, 34b both having their sources connected to the power supply VDD and their gates connected to the fourth node N4. PMOS transistor 34a has its drain connected to the fourth node N4. PMOS transistor 34b has its drain connected to the fifth node N5. Another NMOS transistor 35 has its source connected to ground and its drain connected to the fifth node N5. An inverter 36 inverts the phase of the enable signal EN, and the gate of NMOS transistor 35 receives the inverted enable signal from the inverter 36. The bias potential BL is taken from the fifth node N5.

In the bias section 30, when the enable signal EN is inactive (low), PMOS transistor 31 and NMOS transistor 35 are switched on, pulling the fourth node N4 up to the high level, so that PMOS transistors 34a, 34b are switched off, and dropping the fifth node N5 and the output bias potential BL to the ground level. When the enable signal EN is active (high), PMOS transistor 31 and NMOS transistor 35 are switched off, and PMOS transistor 34a and NMOS transistor 32a mirror the current conducted by the series circuit that includes PMOS transistor 34a, NMOS transistor 32a, and the resistor 33. The potential at the drain and gate of NMOS transistor 32b is output to the amplifier section 10A as the bias potential BL.

The operation of the differential amplifier in FIG. 3 at a standby-to-active transition will now be described with reference to the waveform diagram in FIG. 4, under the assumption that the differential input signals INP, INM are held at the VDD level in the standby state.

In the standby state, in which the enable signal EN is inactive (low), the bias section 30 suspends operation and pulls the bias potential BL down to the ground level, switching off NMOS transistor 12. Since the gates of NMOS transistors 15a, 15b also receive the low enable signal EN, NMOS transistors 15a, 15b are also switched off. This leaves the first node N1 in a floating state, so that it maintains its existing level. NMOS transistors 11a, 11b accordingly maintain their existing body potentials VB11. PMOS transistor 14 is switched on, and pulls the signal SN3 at the third node N3 up to the VDD level. PMOS transistor 21 in the output section 20 is accordingly switched off, and the output signal (OUT) is at the ground level.

When the enable signal EN becomes active (high), the bias section 30 starts operating, supplying the bias potential BL to the amplifier section 10A. NMOS transistors 15a, 15b are switched on. NMOS transistor 12 starts conducting the predetermined operating current to ground. The existing level of the signal SN1 at the first node N1 and existing body potentials VB11 of NMOS transistors 11a, 11b remain substantially unchanged. The substrate effect of NMOS transistors 11a, 11b accordingly does not alter their transistor characteristics, and the differential amplifier circuit does not malfunction when the gates of NMOS transistors 11a, 11b receive the differential input signals INP, INM.

Although the substrate effect of source-tied NMOS transistors 15a, 15b alters their transistor characteristics when the enable signal EN goes high, since their gate-source voltages are well above their threshold voltage, the alterations are negligible.

Although the potential at the first node N1 and the body potential of NMOS transistors 11a, 11b gradually fall due to current leakage etc. in the standby state, even if these potentials fall to the ground level, the substrate effect at the next standby-to-active transition disrupts circuit operation less than does the substrate effect in the conventional circuit, in which the body potentials are pulled up toward the power supply level during standby.

As described above, NMOS transistors 15a, 15b in the first embodiment completely isolate NMOS transistors 11a, 11b from the power supply potential VDD in the standby state. Since NMOS transistors 11a, 11b are also isolated from ground, they maintain their body potential VB11 at the level that existed immediately before the standby state, so that the substrate effect does not alter the transistor characteristics when the enable signal EN becomes active again. Malfunction of the differential amplifier circuit at standby-to-active transitions can therefore be prevented.

In the description above, NMOS transistors are used as MOS transistors of the first channel type and PMOS transistors are used as MOS transistors of the second channel type. In a variation of the first embodiment, PMOS transistors are used as MOS transistors of the first channel type, NMOS transistors are used as MOS transistors of the second channel type, and the polarity of the power supply, enable signal, and so on is reversed. Similar variations apply to the second and third embodiments described below.

Second Embodiment

Figure 5:
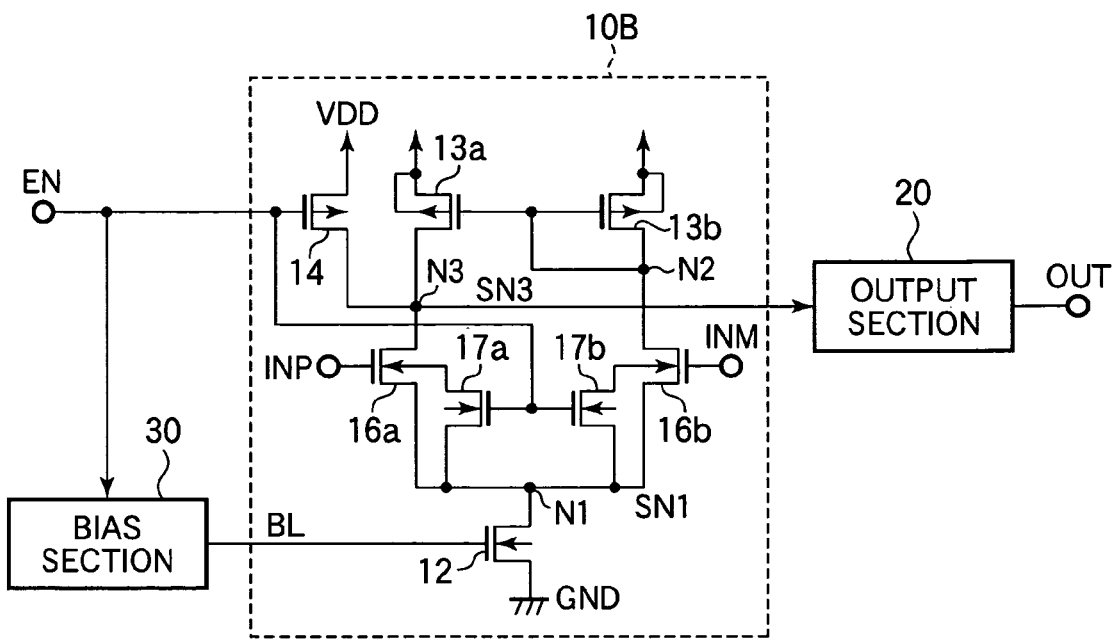
FIG. 5 is a circuit diagram of a differential amplifier according to a second embodiment of the invention.

Referring to FIG. 5, the second embodiment is a differential amplifier comprising an amplifier section 10B, an output section 20, and a bias section 30. The output section 20 and bias section 30 have the same internal structure as in the first embodiment.

The amplifier section 10B in the second embodiment differs from the amplifier section 10A in the first embodiment in the configuration of its NMOS transistor pairs. Specifically, NMOS transistors 16a, 16b and 17a, 17b in FIG. 5 replace NMOS transistors 11a, 11b and 15a, 15b in FIG. 3.

NMOS transistors 16a, 16b receive differential input signals INP, INM at their gates. The sources of both transistors 16a, 16b are connected to a first node N1, which is connected to the drain of NMOS transistor 12. NMOS transistor 16b has its drain connected to a second node N2; NMOS transistor 16a has its drain connected to a third node N3.

NMOS transistors 17a, 17b both receive the enable signal EN at their gates. NMOS transistor 17a has its source connected to the first node N1 and its drain connected to the body of NMOS transistor 16a. NMOS transistor 17b has its source connected to the first node N1 and its drain connected to the body of NMOS transistor 16b.

As in the first embodiment, the gate of NMOS transistor 12 receives a bias potential BL from the bias section 30 and the source of NMOS transistor 12 is connected to ground; a pair of source-tied PMOS transistors 13a, 13b, both having their sources connected to the power supply (VDD), are provided; PMOS transistor 13a has its gate connected to the second node N2 and its drain connected to a third node N3; PMOS transistor 13b has its gate and drain both connected to the second node N2.

Figure 6:
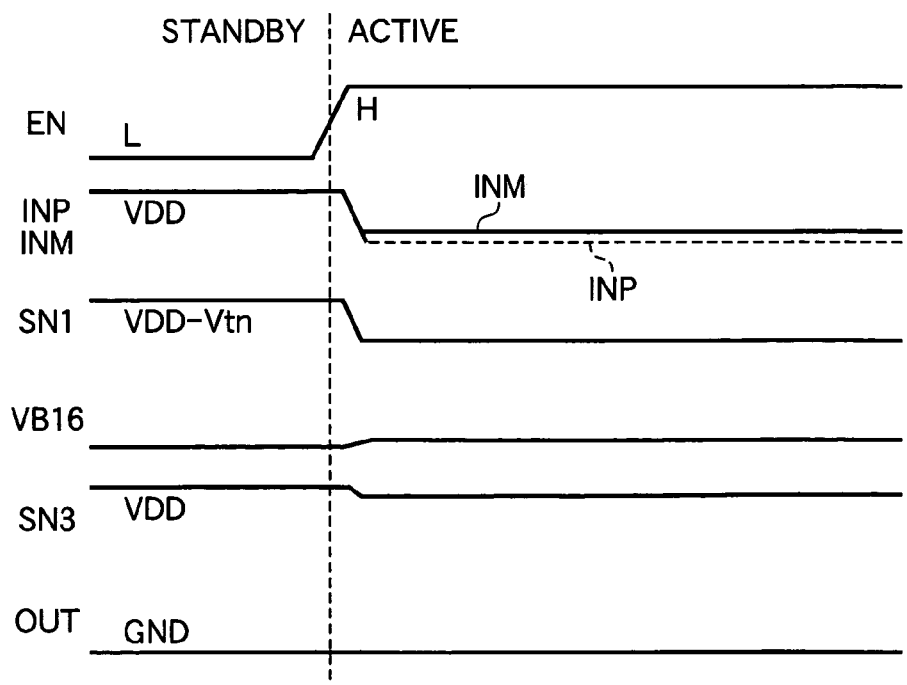
FIG. 6 is a waveform diagram illustrating the operation of the differential amplifier in FIG. 5 at a standby-to-active transition.

The operation of the differential amplifier in FIG. 5 at a standby-to-active transition will now be described with reference to the waveform diagram in FIG. 6.

In the standby state, the bias section 30 suspends operation and pulls the bias potential BL down to the ground level, switching off NMOS transistor 12. Since the gates of NMOS transistors 17a, 17b also receive the low enable signal EN, NMOS transistors 17a, 17b are also switched off. This leaves the bodies of NMOS transistors 16a, 16b in a floating state, so that NMOS transistors 16a, 16b maintain their body potentials VB16 at the level that existed just before the standby state.

PMOS transistor 14 is switched on, pulling the signal SN3 at the third node N3 up to the power supply potential VDD. PMOS transistor 21 in the output section 20 is accordingly switched off, and the output signal (OUT) is at the ground level.

When the enable signal EN becomes active (high), the bias section 30 starts operating, supplying the bias potential BL to the amplifier section 10B. NMOS transistors 17a, 17b are switched on, connecting the source of NMOS transistor 16a to the body of NMOS transistor 16a, and connecting the source of NMOS transistor 16b to the body of NMOS transistor 16b. NMOS transistor 12 then starts conducting a predetermined operating current to ground. The existing level of the signal SN1 at the first Node N1 and the existing body potentials VB16 of NMOS transistors 16a, 16b remain substantially unchanged. The substrate effect of NMOS transistors 16a, 16b accordingly does not alter the transistor characteristics, and the differential amplifier circuit does not malfunction, regardless of the potential levels of the differential input signals INP, INM.

As described above, the second embodiment has NMOS transistors 17a, 17b that connect the bodies of NMOS transistors 16a, 16b to the sources of NMOS transistors 16a, 16b to form source-tied transistors when the enable signal EN is active and that isolate the bodies from the sources in the standby state. The second embodiment accordingly has the same effect as the first embodiment in preventing the body potentials from being pulled up when node N3 is pulled up during standby. A further effect is that if the body potentials require adjustment at a standby-to-active transition, either because the levels of the differential input signals INP, INM have changed or because the body potentials have discharged to ground during standby, the adjustment can be accomplished comparatively quickly. This is true because the necessary charge or discharge current flows through the channels of NMOS transistors 17a and 17b instead of having to cross pn junctions in NMOS transistors 16a and 16b.

Although NMOS transistors 15a, 15b in the first embodiment need to have low on-resistance and must therefore have comparatively large dimensions, so as not to affect the levels of the amplified signals, NMOS transistors 17a, 17b in the second embodiment only have to tie down the body potentials of NMOS transistors 16a, 16b, so the dimensions of NMOS transistors 17a, 17b can be comparatively small.

In a variation of the second embodiment, the bodies of NMOS transistors 16a, 16b are connected to the first node N1 through a single NMOS transistor.

Third Embodiment

Figure 7:
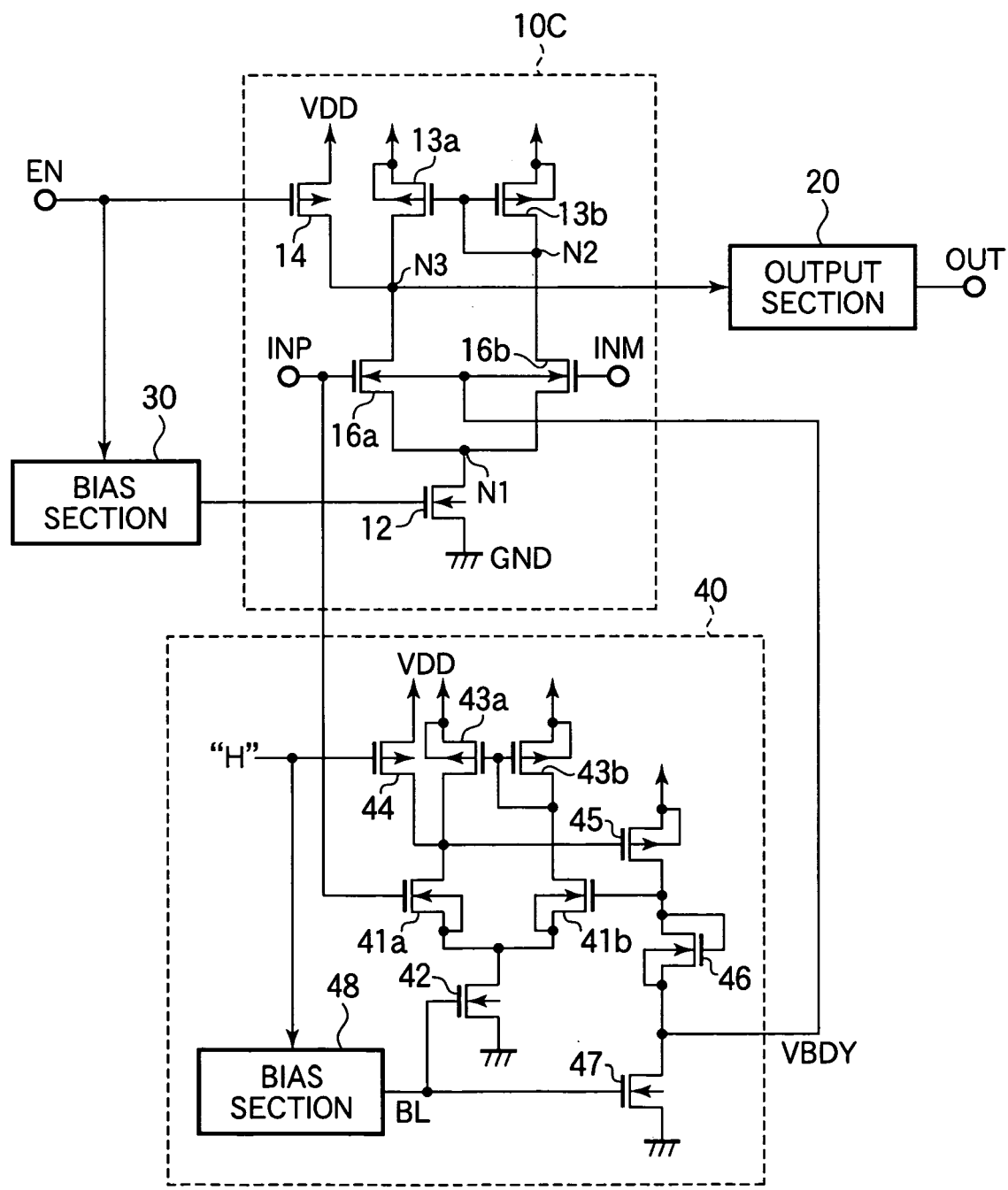
FIG. 7 is a circuit diagram of a differential amplifier according to a third embodiment of the invention.

Referring to FIG. 7, the third embodiment is a differential amplifier comprising an amplifier section 10C, an output section 20, a bias section 30, and a regulator section 40.

The amplifier section 10C in the third embodiment differs from the amplifier section 10B in the second embodiment by omitting NMOS transistors 17a and 17b. The NMOS transistors 16a, 16b that receive the differential input signals INP, INM are accordingly not source-tied, even when the enable signal EN is active. Instead, the bodies of NMOS transistors 16a, 16b are both connected to the regulator section 40, from which they receive a body potential VBDY.

As in the second embodiment, NMOS transistors 16a, 16b have their sources connected to a first node N1, which is connected to the drain of an NMOS transistor 12 that receives a bias potential BL from the bias section 30 at its gate; the source of NMOS transistor 12 is connected to ground; a pair of source-tied PMOS transistors 13a, 13b, both having their sources connected to the power supply (VDD), are provided; PMOS transistor 13a has its gate connected to a second node N2 and its drain connected to a third node N3, PMOS transistor 13b has its gate and drain both connected to the second node N2, NMOS transistor 16a has its drain connected to the third node N3, and NMOS transistor 16b has its drain connected to the second node N2.

The regulator section 40 has the same general circuit configuration as the entire differential amplifier in FIG. 1, including a pair of source-tied NMOS transistors 41a, 41b that form a differential input stage. The sources of both transistors 41a, 41b are connected to ground through an NMOS transistor 42. The gate of NMOS transistor 41a is connected to the gate of NMOS transistor 16a in the amplifier section 10C and receives the INP input signal.

The regulator section 40 also includes a pair of source-tied PMOS transistors 43a, 43b both having their sources connected to the power supply (VDD). PMOS transistor 43a has its gate connected to the drain of PMOS transistor 43b and its drain connected to the drain of NMOS transistor 41a. PMOS transistor 43b has its gate and drain both connected to the drain of NMOS transistor 41b. Another PMOS transistor 44 has its source connected to the power supply VDD and its drain connected to the drain of PMOS transistor 41a. The gate of PMOS transistor 44 is tied to the high level, so that PMOS transistor 44 is always switched off.

In addition, the regulator section 40 includes a source-tied PMOS transistor 45, a source-tied NMOS transistor 46, and an NMOS transistor 47 connected in series between the power supply and ground to form an output stage. PMOS transistor 45 has its source connected to the power supply (VDD), its gate connected to the drain of NMOS transistor 41a, and its drain connected to the drain and gate of NMOS transistor 46 and the gate of NMOS transistor 41b. NMOS transistor 47 has its source connected to ground and its drain connected to the source of NMOS transistor 46. The gates of NMOS transistors 42 and 47 receive a bias potential BL from a bias section 48. Bias section 48 has the same circuit configuration as bias section 30 but its control input signal is tied to the high level, so that it always outputs the same bias potential BL, equal to the bias potential output by bias section 30 when the enable signal EN is high.

The body potential VBDY is taken from the source of NMOS transistor 46 and the drain of NMOS transistor 47. Transistors 45, 46, and 47 are sized so that when the enable signal EN is active, the body potential VBDY is substantially equal to the potential level of node N1 in the differential amplifier section 10C. When the enable signal EN is inactive, the body potential VBDY has substantially the same level that node N1 would have if the enable signal EN were active and node N3 were not pulled up to the VDD level. Internal feedback in the regulator section 40 operates to stabilize the body potential VBDY at these levels.

The output section 20 and the bias section 30 in FIG. 7 are the same as the output section 20 and the bias section 30 in FIG. 3.

Figure 2:
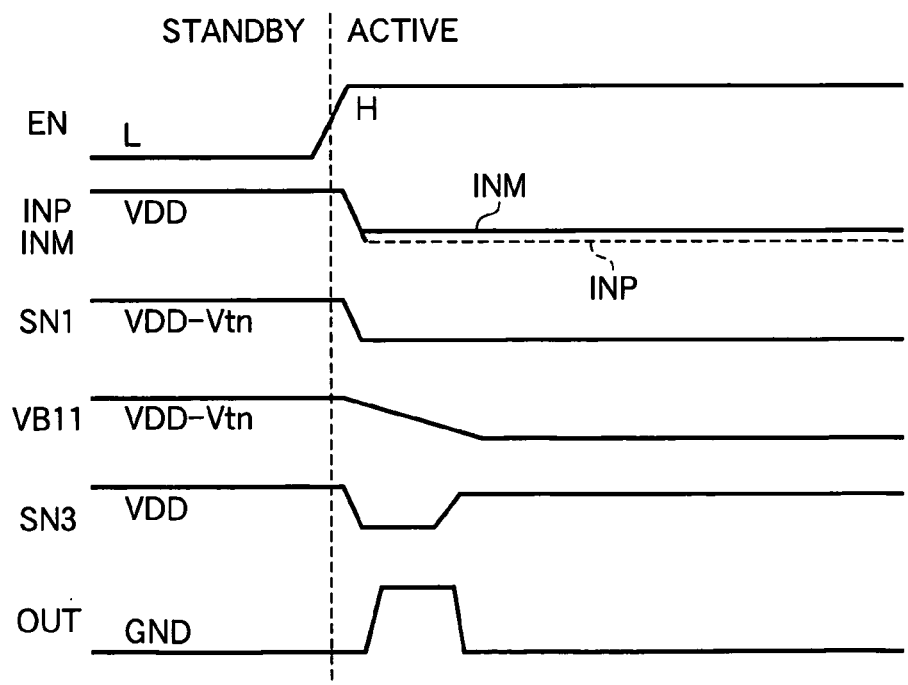
FIG. 2 is a waveform diagram illustrating the operation of the differential amplifier in FIG. 1 at a standby-to-active transition.

The difference between the operation of the differential amplifier in the third embodiment and the operation of the differential amplifier in the second embodiment is that the regulator section 40 actively supplies an appropriate body potential VBDY to the bodies of NMOS transistors 16a, 16b, even in the standby state. During standby, accordingly, the body potentials of NMOS transistors 16a, 16b neither rise to the VDD−Vtn level as illustrated in FIG. 2, nor fall to the ground level. At a standby-to-active transition, even if the levels of the input signals INP and INM change, only a relatively small adjustment in the body potential VBDY is necessary, and the regulator section 40 can quickly charge or discharge the bodies of NMOS transistors 16a, 16b to the appropriate levels. The third embodiment is therefore capable of substantially eliminating malfunctions of the differential amplifier due to substrate effects.

One variation of the preceding embodiments has already been mentioned, but those skilled in the art will recognize that further variations are possible within the scope of the invention, which is defined in the appended claims.

What is claimed is:

1. A differential amplifier circuit formed on a silicon-on-insulator (SOI) substrate, comprising:
    a bias section activated and deactivated by an enable signal, outputting a predetermined bias potential when activated, and outputting a first power-supply potential when deactivated;
    a first metal-oxide-semiconductor (MOS) transistor of a first channel type, having a source receiving the first power-supply potential, a gate receiving the potential output by the bias section, and a drain connected to a first node;
    a source-tied second MOS transistor of the first channel type, having a source connected to the first node, a gate receiving a first differential input signal, and a drain connected to a second node;
    a source-tied third MOS transistor of the first channel type, having a source connected to the first node, a gate receiving a second differential input signal, and a drain connected to a third node;
    a source-tied fourth MOS transistor of the first channel type, having a source connected to the second node, a gate receiving the enable signal, and a drain connected to a fourth node;
    a source-tied fifth MOS transistor of the first channel type, having a source connected to the third node and, a gate receiving the enable signal, and a drain connected to a fifth node;
    a source-tied first MOS transistor of a second channel type, having a source receiving a second power-supply potential, a gate connected to the fourth node, and a drain connected to the fourth node;
    a source-tied second MOS transistor of the second channel type, having a source receiving the second power-supply potential, a gate connected to the fourth node, and a drain connected to the fifth node; and
    an output section connected to the fifth node, generating an output signal from a potential of the fifth node.

2. The differential amplifier circuit of claim 1, wherein the first channel type is an n-channel type and the second channel type is a p-channel type.

3. The differential amplifier circuit of claim 1, wherein the first channel type is a p-channel type and the second channel type is an n-channel type.

4. The differential amplifier circuit of claim 1, wherein the output section comprises:
    a source-tied third MOS transistor of the second channel type, having a gate connected to the fifth node; and
    a resistor connected in series with the source-tied third MOS transistor of the second channel type.

5. The differential amplifier circuit of claim 1, further comprising a sixth MOS transistor of the second channel type, having a source receiving the second power-supply potential, a gate receiving the enable signal, and a drain connected to the fifth node.

6. The differential amplifier circuit of claim 5, wherein the bias section comprises:
    three MOS transistors of the second channel type, having respective sources receiving the second power-supply potential, a first one of the three MOS transistors having a gate receiving the enable signal and a drain connected to a sixth node, a second one of the three MOS transistors having a gate and drain connected to a sixth node, a third one of the three MOS transistors having a gate connected to the sixth node and a drain connected to a seventh node;
    a resistor;
    a seventh MOS transistor of the first channel type, having a source receiving the first power-supply potential through the resistor, a gate connected to the seventh node, and a drain connected to the sixth node;
    an eighth MOS transistor of the first channel type, having a source receiving the first power-supply potential, a gate connected to the seventh node, and a drain connected to the seventh node;
    an inverter inverting the enable signal; and
    a ninth MOS transistor of the first channel type, having a source receiving the first power-supply potential, a gate receiving the inverted enable signal from the inverter, and a drain connected to the seventh node and to the gate of the first MOS transistor of the first channel type.

* * * * *